(12) United States Patent
Cherif et al.

(10) Patent No.: US 12,348,194 B1
(45) Date of Patent: Jul. 1, 2025

(54) DYNAMIC TRANSLINEAR CURRENT MULTIPLIER FOR ANALOG COMPUTING

(71) Applicant: Northrop Grumman Systems Corporation, Falls Church, VA (US)

(72) Inventors: Bouchaib Cherif, Yorktown Heights, NY (US); Philippe Pouliquen, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 14 days.

(21) Appl. No.: 18/392,366

(22) Filed: Dec. 21, 2023

(51) Int. Cl.
    *H03F 1/32*     (2006.01)
    *H03F 3/04*     (2006.01)
    *H03F 3/45*     (2006.01)

(52) U.S. Cl.
    CPC ....... *H03F 1/3205* (2013.01); *H03F 3/45273* (2013.01); *H03F 2200/261* (2013.01); *H03F 2200/513* (2013.01)

(58) Field of Classification Search
    CPC .............. H03F 1/3205; H03F 3/45273; H03F 2200/261; H03F 2200/513
(Continued)

(56) References Cited

U.S. PATENT DOCUMENTS 6,812,778 B1    11/2004    Yeo et al.
11,449,689 B1    9/2022    Far
(Continued)

OTHER PUBLICATIONS

PCT ISR & Opinion Corresponding to PCT/US2024/042743 filed Nov. 27, 2024.
(Continued)

*Primary Examiner* — Hieu P Nguyen
(74) *Attorney, Agent, or Firm* — Dority & Manning, P.A.

(57) ABSTRACT

According to some other aspects of the present disclosure, an electrical circuit comprises a first capacitive element, a first transistor, a second capacitive element, and a second transistor. The circuit receives a first input current, a second input current, a third input current, and an input voltage. The circuit is configured to generate a first voltage by providing the input voltage and the first input current to the first transistor. The first voltage difference is the difference between the first voltage and the input voltage, and is logarithmically related to the first input current. The circuit may also be configured to store the first voltage as the first charged state of the first capacitive element. The circuit is further configured to generate a second voltage by providing the second input current and the first charged state of the first capacitive element to the first transistor. The second voltage difference is the difference between the first voltage and the second voltage, and is logarithmically related to the second input current. The circuit is additionally configured to generate a third voltage by providing the second voltage and the third input current to the second transistor. The third voltage difference is the difference between the third voltage and the second voltage, and is logarithmically related to the third input current. The circuit may also be configured to store the third voltage as the second charged state of the second capacitive element. The circuit is further configured to generate an output current by providing the input voltage and the second charged state of the second capacitive element to the second transistor. The output current is exponentially related to the fourth voltage difference, which is the difference between the third voltage and the input voltage. The output current is equivalent to a ratio of a product of the first and third input currents to the second input current.

20 Claims, 8 Drawing Sheets

(58) Field of Classification Search
USPC .................................................. 330/288, 277
See application file for complete search history.

(56) References Cited

U.S. PATENT DOCUMENTS

| | | |
|---|---|---|
| 11,544,037 B2 | 1/2023 | Chakraborty et al. |
| 2011/0084864 A1 | 4/2011 | Balachandran et al. |
| 2013/0029620 A1 | 1/2013 | Liu et al. |
| 2014/0043087 A1* | 2/2014 | Li .......................... G06G 7/16 327/358 |
| 2017/0070210 A1 | 3/2017 | Kultran et al. |
| 2019/0272395 A1 | 9/2019 | Schie et al. |
| 2020/0278837 A1 | 9/2020 | Yamazaki et al. |
| 2021/0216282 A1 | 7/2021 | Marukame et al. |
| 2022/0006387 A1 | 1/2022 | Hsieh et al. |
| 2022/0309255 A1 | 9/2022 | Su |

OTHER PUBLICATIONS

Wikipedia, Translinear Circuit, 5 pages. Retrieved Dec. 21, 2023 from webpage: https://en.wikipedia.org/wiki/Translinear_circuit.
Wegmann, Design and Analysis Techniques for Dynamic Current Mirrors, EPFL Thesis No. 890, Scientific Production and Competences, 1990, 198 pages. https://doi.org/10.5075/epfl-thesis-890.

* cited by examiner

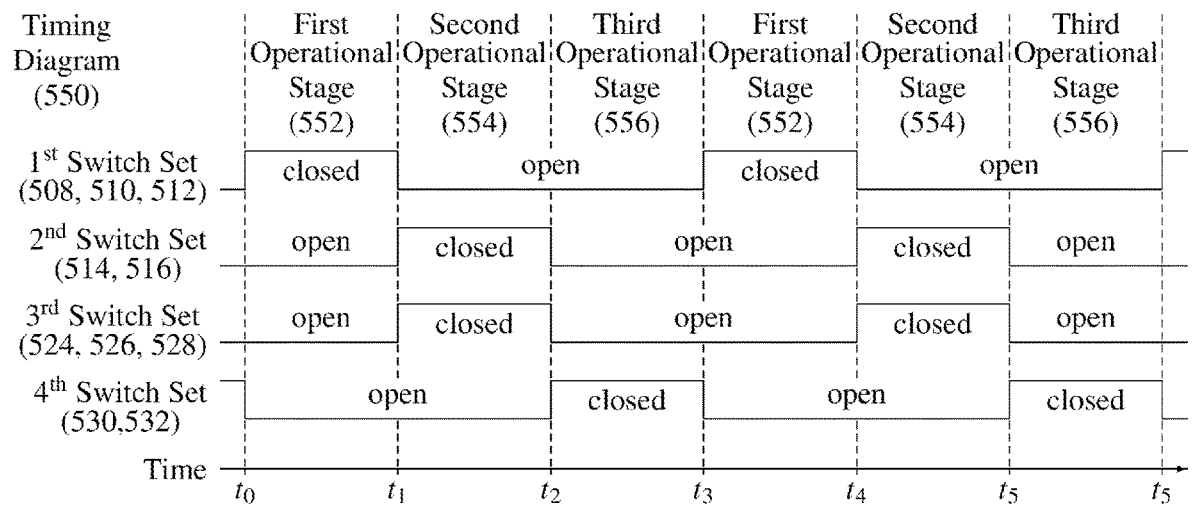
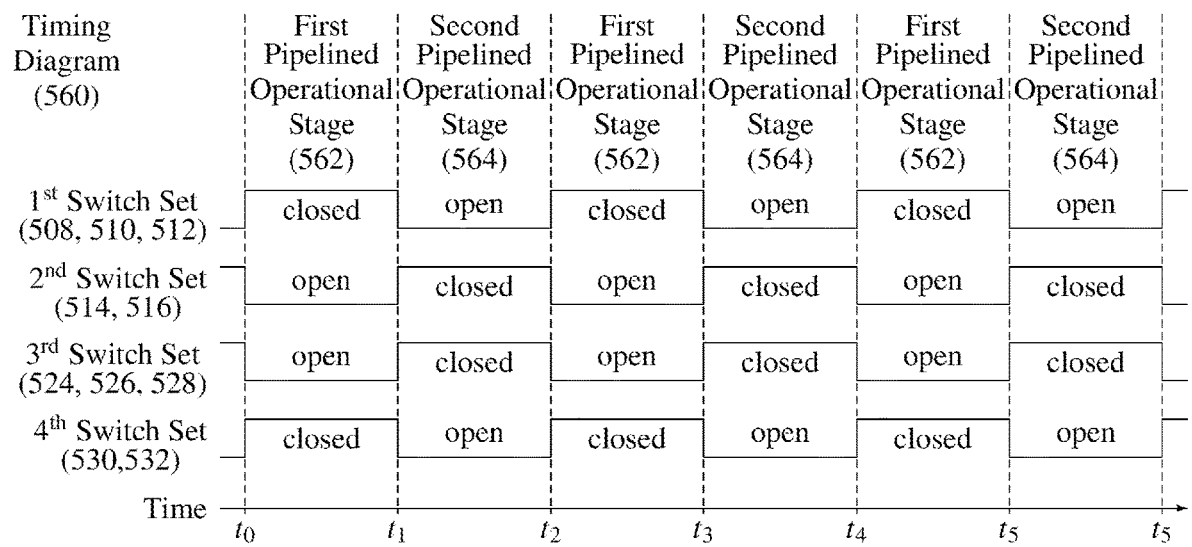
FIG. 2B
FIG. 2C

DYNAMIC TRANSLINEAR CURRENT MULTIPLIER FOR ANALOG COMPUTING

FIELD

The present disclosure relates generally to current multipliers, and more particularly to dynamic translinear current multipliers for analog computing.

BACKGROUND

Translinear circuits are analog electronic circuits that employ the relationship between exponential functions to perform mathematical operations. The term translinear refers to operating a device or circuit to transform an input in a non-linear fashion to an intermediate form, then using the same or similar circuit to reverse the transformation to produce an output. The overall relation between the output and the input is linear, hence the term trans-linear. Alterations of the intermediate form can then be used to generate outputs that could not be obtained otherwise through normal (or linear) processing of the input. The most common application of translinear circuits operates transistors and diodes in the exponential region (or sub-threshold region for field-effect transistors) of their characteristics. Operating these circuits in their translinear regime allows them to perform a variety of functions on currents, including multiplication, division, and exponentiation. The exponential nature of these devices is what makes translinear circuits unique and powerful, as they can perform complex computations with relatively simple circuitry. Thus, translinear circuits may be employed in analog signal processing and analog computing applications.

BRIEF DESCRIPTION

Aspects and advantages of the present disclosure will be set forth in part in the following description, or may be obvious from the description, or may be learned through practice of the present disclosure.

According to some aspects of the present disclosure, a dynamic electrical circuit receives a first input current, a second input current, a third input current, and an input voltage. The circuit comprises an input branch and an output branch. The input branch includes a first transistor—and a first capacitive element. The output branch includes a second transistor—and a second capacitive element. The electrical circuit is configured to generate a first voltage difference associated with the first input current. The first voltage difference is a voltage difference between a first voltage and the input voltage. The first voltage is related to the first input current. The electrical circuit is configured to generate a first charged state of the first capacitive element by storing the first voltage. The electrical circuit is configured to generate a second voltage difference associated with the second input current. The second voltage difference is a voltage difference between the first voltage and a second voltage. The second voltage difference is related to the second input current. The electrical circuit is configured to generate a third voltage difference associated with the third input current. The third voltage difference is a voltage difference between a third voltage and the second voltage. The third voltage difference is related to the third input current. The electrical circuit is configured to generate an output current by providing the input voltage and the third voltage. The output current is related to a fourth voltage difference. The fourth voltage difference is the difference between the third voltage and the input voltage. A sum of the first voltage difference and the third voltage difference is equivalent to a sum of the second voltage difference and the fourth voltage difference.

These and other features, aspects, and advantages of the present disclosure will be further supported and described with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which:

FIG. 2B shows a timing diagram for the cyclic (and non-pipelined) operation of the translinear current multiplier of FIG. 2A, according to various embodiments;

FIG. 2C shows a timing diagram for the cyclic pipelined operation of the translinear current multiplier of FIG. 2A, according to various embodiments;

Figure 1A:
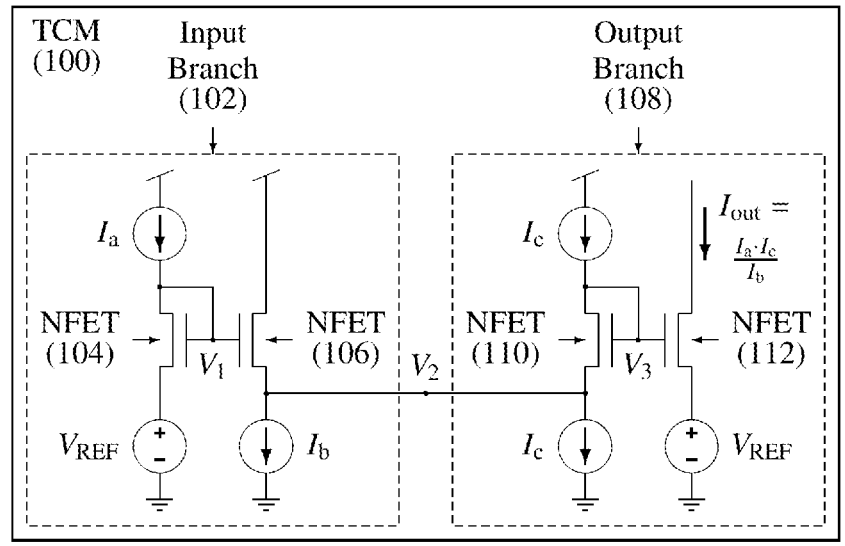
FIG. 1A shows an embodiment of a continuous time two branch translinear current multiplier.

Repeat use of reference characters in the present specification and drawings is intended to represent the same or analogous features or elements of the present technology.

DETAILED DESCRIPTION

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part can be used with another embodiment to yield a still further embodiment. Thus, it is intended that the present disclosure covers such modifications and variations as come within the scope of the appended claims and their equivalents.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Approximating language, as used herein throughout the specification and claims, is applied to modify any quantitative representation that could permissibly vary without resulting in a change in the basic function to which it is related. Accordingly, a value modified by a term or terms, such as "about," "approximately," "generally," and "substantially," is not to be limited to the precise value specified. In at least some instances, the approximating language may correspond to the precision of an instrument for measuring the value, or the precision of the methods or apparatus for constructing or manufacturing the components and/or systems. For example, the approximating language may refer to being within a ten percent margin.

Moreover, the technology of the present application will be described in relation to exemplary embodiments. The word "exemplary" is used herein to mean "serving as an example, instance, or illustration." Any embodiment described herein as "exemplary" is not necessarily to be construed as preferred or advantageous over other embodiments. Additionally, unless specifically identified otherwise, all embodiments described herein will be considered exemplary.

As used herein, the term "and/or," when used in a list of two or more items, means that any one of the listed items can be employed by itself, or any combination of two or more of the listed items can be employed. For example, if a composition or assembly is described as containing components A, B, and/or C, the composition or assembly can contain A alone; B alone; C alone; A and B in combination; A and C in combination; B and C in combination; or A, B, and C in combination.

In general, examples of the present subject matter are directed to designs and architectures for translinear current multipliers (TCM). A TCM is a type of electronic circuit that uses the translinear principle to multiply (and/or divide) electrical currents. The translinear principle includes the exponential relationship between a voltage applied to a first terminal of a transistor and the current at a second terminal of the transistor. For bipolar junction transistors (BJTs), the current is the current transmitted between the emitter and collector terminals, while the applied voltage is between the base and emitter terminals. For field effect transistors (FETs), the current is the current transmitted between the drain and source terminals and the applied voltage is between the gate and source terminals (e.g., often referred to as the gate-to-source voltage).

Various embodiments of TCMs are discussed herein. In much of the discussion, FETs are employed to demonstrate the design, architecture, and operations of the various TCM embodiments. However, the embodiments are not so limited, and at least some of the embodiments may employ BJTs in addition to, or in the alternative to, the employment of FETs.

The FETs of the various embodiments may be metal-oxide-semiconductor FETs (MOSFETs). The various TCMs may be fabricated on a complementary metal-oxide-semiconductor (CMOS) process. As such, some of the FETs may be P-MOS FETs (e.g., a p-channel FET), while other FETs may be N-MOS FETs (e.g., an n-channel FET). In some embodiments, a FET may be a p-channel or an n-channel junction FET (JFET).

Some embodiments include multiple branches (e.g., a first branch and a second branch). The first branch may receive a first input current and a second input current. The second branch may receive a third input current and may provide an output current. The output current may be equivalent to the product of the third input current with the ratio of the first and second input currents. The TCMs of the various embodiments are scalable, such that more than two branches may be included for additional multiplications and/or divisions of the input currents. For example, some embodiments may include three branches: a first branch, a second branch, and a third branch. The first branch receives first and second input currents, the second branch receives third and fourth input currents, and the third branch receives a fifth input current and generates the output current. In such embodiments, the output current is equivalent to the product of the fifth input current with the ratio of the first and second currents and the ratio of the third and fourth input currents. In such embodiments, the first branch may be referred to as the input branch, the third branch (or last branch) may be referred to as the output branch, and the second branch (and any additional branches) may be referred to as intermediate branches. In some embodiments, all input and output currents (and their associated voltages) may be associated with direct current (DC) signals. However, the embodiments are not so limited and at least some embodiments may be directed towards time-varying current signals, such as alternating current (AC) signals.

This scalability can continue to have more than three branches (e.g., an input branch, an output branch, and two or more intermediate branches). Each input branch receives two input currents, each intermediate branch receives another two input currents, and the output branch receives another input current and generates an output current. The output current is equivalent to the product of the input current received by the output branch with the ratio of the two input currents of the input branch and each intermediate branch.

That is, each input branch and each intermediate branch (of a TCM) is associated with an input current ratio for its two input currents. For a given input branch or intermediate branch, a first input current that is included as the numerator in the input current ratio for the given input branch or intermediate branch may be referred to as the counterclockwise (CCW) input current for the given input branch or intermediate branch. A second input current that is included as the denominator in the input current ratio for the given input branch or intermediate branch may be referred to as a clockwise (CW) input current for the given input branch or intermediate branch. For the output branch of the TCM, the input current of the output branch may be a CCW input current for the output branch, and the output current may be a CW output current for the output branch. The usage of the terms CCW and CW for translinear elements is historical, and refers to their orientation in BJT implementations. Thus, the output current (for a TCM) is equivalent to the product of the input current received by the output branch with the input current ratios of each of the input branches of the TCM. Stating this another way, the output current of a TCM is equivalent to the ratio of the product of all the CCW input currents to the product of all of the CW input currents. Because the total number of CCW input currents is one greater than the total number of CW input currents, the units on the ratio of the two products of currents is amps (or some other unit of electrical current). Noting that the output current is a CW current, still another way to state this result is that the product of all CCW currents (of the TCM) is equivalent to the product of all the CW currents (of the TCM). This result is a consequence of the translinear nature of a correctly constructed TCM.

The branches of a TCM may be arranged in a cascading fashion. In the following discussion, the multiple branches of a TCM are discussed as being arranged in a (horizontal with respect to the page) linear fashion (e.g., an ordered 1D array of cascading branches). Although, the embodiments are not so limited and the branches may be arranged in alternative fashions, e.g., 2D and 3D arrays of cascading branches. That is, the horizontal linear arrangements of cascading branches are logical arrangements (or positioning) of the branches, and the actual physical arrangement (or positioning) of the branches may take on a 2D or 3D arrangement on an integrated circuit (e.g., a CMOS chip). Thus, in the following discussion, the arrangement of the branches is logically (i.e., not necessarily physically) assumed to be a left-to-right 1D chain of cascading branches. A first input branch is assumed to be the left-most branch of the 1D chain, while the output branch is assumed to be the right-most branch of the 1D chain. Each of the intermediate branches may be logically arranged in the 1D chain between the left-most input branch and the right-most output branch. Each intermediate branch has a left-neighboring branch and a right-neighboring branch. The input branch has only a right-neighboring branch, and the output branch has only a left-neighboring branch. The terms left and right refer to an observer looking at a page that includes a representation of the 1D chain of branches.

In some embodiments, each branch of a TCM may include a pair of translinear elements (TEs) such as FETs. Such embodiments may be referred to as continuous time TCMs. In a continuous time TCM, the first and second FETs of the pair may each pass (or transmit) one of the two input currents between its drain and source terminals. The FET (of a pair of FETs of a given input branch or intermediate branch) that transmits the CCW input current (of the given input branch or intermediate branch) may be referred to as the CCW FET of the given input branch or intermediate branch. Likewise, the other FET of the given input branch or intermediate branch that transmits the CW input current (of the given input branch or intermediate branch) may be referred to as the CW FET of the given input branch or intermediate branch. Similarly, in the output branch of the continuous time TCM, the FET that transmits the input current (of the output branch) may be referred to as the CCW FET of the output branch and the other FET that transmits the output current is referred to as the CW FET of the output branch. Thus, each branch of a continuous time TCM may have a CCW FET and a CW FET. In the logical 1D chain of cascading branches of a TCM discussed above, the CCW FET is the logical-left FET of the branch and the CW FET is the logical-right FET of the branch.

In some embodiments, all FETs may be matched. Matching FETs may be required to have similar characteristics (for example, the base of the exponent in the transistor's exponential region is the same) but not necessarily the same size. In other embodiments, the FETs may be matched pair-wise, where one CCW FET is matched with another CW FET in the circuit. In other embodiments, the FETs may be matched pair-wise within each branch. In other embodiments, the FETs may be matched pair-wise within each branch and may also be similarly sized. Due to process variations (e.g., variations of a CMOS process), the ability to manufacture precise matching FETs may be difficult. The need for precise matching of the paired transistors is enhanced in the exponential region of their operation. As such, the performance of a continuous time TCM may be degraded.

To overcome such issues, other embodiments include a discrete-time TCM, that is operated in multiple stages. Such embodiments may be referred to as a dynamic TCM. For a dynamic TCM, each branch of the TCM includes a single FET and a capacitive element. That is, the matching FETs of a continuous time TCM are replaced by a single FET. Each branch has a set of switches that are employed to transition the configurations of the FET and capacitive element in the branch. In some embodiments, the number of operational stages may be two or more. For instance, in a non-limiting embodiment of a two branch dynamic TCM, the input branch may include a first transistor and a first capacitive element. The output branch may include a second transistor and a second capacitive element. In some of the operational stages, the FET of a branch may function as a CCW FET, in that it is operating to transmit the CCW current. In other stages, the FET of the branch may function as a CW FET, in that it is operating to transmit the CW current. In some embodiments, the CCW current is employed to charge the capacitive element. The charged capacitive element is enabled to provide the gate terminal voltage for the transistor when it is transmitting the CW current. That is, the capacitive element is employed as a storage (or memory) means/mechanism. The capacitive element stores (e.g., learns) the voltage of the CCW currents, and uses the stored voltage to drive the CW currents.

Each branch of a TCM has at least four signal lines: a first upper line, a second upper line, a first lower line, and a second lower line. Within the 2D plane (of the page), the terms upper and lower refer to the vertical dimension that is perpendicular to the horizontal chain of branches (represented on a 2D page). For continuous time TCMs, the CCW FET of the branch electrically couples the first upper line with the first lower line and the CW FET of the branch electrically couples the second upper line with the second lower line. Thus, the first upper line may be referred to as a CCW upper line (of the branch) and the first lower line may be referred to as a CCW lower line (of the branch). Similarly, the second upper line may be referred to as a CW upper line (of the branch) and the second lower line may be referred to as a CW lower line (of the branch). Note that dynamic TCMs have a single FET, but the CCW and CW terms may still be applied to the signal lines of a dynamic TCM. The following discussion assumes a continuous time TCM with matched and similarly sized CCW and CW FETs, however, the concepts are relevant for the dynamic TCM embodiments also.

In some embodiments, the drain terminal of the CCW FET (in a static TCM) is electrically coupled to the first (or CCW) upper line and the source terminal of the CCW FET is electrically coupled to the first (or CCW) lower line. Likewise, the drain terminal of the CW FET is electrically coupled to the second (or CW) upper line and the source terminal of the CW FET is electrically coupled to the second (or CW) lower line. A gate line may couple the gate terminal of the CCW FET to the gate terminal of the CW FET, such that the gate terminals of the CCW and CW FETS have a common voltage. Another line of the branch may couple the CCW upper line to the gate line. The signal transmission line (of the branch) that includes the upper CCW line, the CCW FET, and the lower CCW line may be referred to as the CCW transmission line of the branch. Likewise, the signal transmission (of the branch) that includes the upper CW line, the CW FET, and the lower CW line may be referred to as the CW transmission line of the branch.

The cascading branches of a TCM are coupled to their left and/or right neighboring branches. In a branch of a continuous time TCM that has a left-neighboring branch, the lower CCW line (of the branch) is coupled to the lower CW line of the branch's left-neighboring branch. Likewise, in a branch of a static TCM that has a right-neighboring branch, the lower CW line (of the branch) is coupled to the lower CCW line of the branch's right-neighboring branch. Thus, the input branch of a TCM is coupled to its right-neighboring branch. The output branch of a TCM is coupled to its left-neighboring branch. Each of the intermediate branches is coupled to a left-neighboring branch and a right-neighboring branch.

A dynamic TCM may include an input branch and an output branch. The input branch may include a first transistor and a first capacitive element. The output branch may include a second transistor and a second capacitive element. As noted throughout, a dynamic TCM may include additional intermediate branches. However, for ease of explanation, the following discussion is focused on a two branch dynamic TCM. The two branch dynamic TCM receives a first input current (e.g., $I_a$), a second input current (e.g., $I_b$), a third input current (e.g., $I_c$), and an input voltage (e.g., $V_{REF}$). The two branch dynamic TCM produces an output current (e.g., $I_{out}$). A first voltage difference (e.g., $V_1-V_{REF}$) is associated with the first input current, a second voltage difference (e.g., $V_1-V_2$) is associated with the second input current, a third voltage difference (e.g., $V_3-V_2$) is associated with the third input current and a fourth voltage difference (e.g., $V_3-V_4$) is associated with the output current. The two branch dynamic TCM is operated via a set of (cyclic and synchronous) operational stages. The set of operational stages may include three stages (or two stages if pipelined as described below). The TCM is transitioned between the stages via sets of switches of the first branch and additional sets of switches of the second branch.

In a first operational stage, the TCM is configured (via the switches) to generate a first voltage difference defined as $(V_1-V_{REF})$. The first voltage difference $(V_1-V_{REF})$ is generated by providing the input voltage $(V_{REF})$ and the first input current $(I_a)$ to the first transistor. The first voltage difference $(V_1-V_{REF})$ is logarithmically related to the first input current $(I_a)$. In the first operational stage, the TCM is also configured (via the switches) to store the first voltage $(V_1)$ on the first capacitive element.

In a second operational stage, the TCM is configured (via the switches) to generate a second voltage difference defined as $(V_1-V_2)$. The second voltage difference $(V_1-V_2)$ is generated by providing the second input current $(I_b)$ and the first voltage $(V_1)$ to the first transistor. The first voltage $(V_1)$ is provided by the first capacitance. The second voltage difference $(V_1-V_2)$ is logarithmically related to the second input current $(I_b)$. In the second operational stage, the TCM is also configured (via the switches) to generate a third voltage difference defined as $(V_3-V_2)$. The third voltage difference $(V_3-V_2)$ is generated by providing the second voltage $(V_2)$ and the third input current $(I_c)$ to the second transistor. The second voltage $(V_2)$ is provided by the first transistor. The third voltage difference $(V_3-V_2)$ is logarithmically related to the third input current $(I_c)$. In the second operational stage, the TCM is also configured (via the switches) to store the third voltage $(V_3)$ on the second capacitive element.

During a third operational stage, the TCM is configured (via the switches) to generate the output current $(I_{out})$. The output current $(I_{out})$ is related to a fourth voltage difference defined as $(V_3-V_{REF})$. The output current $(I_{out})$ is generated by providing the third voltage $(V_3)$ and the input voltage $(V_{REF})$ to the second transistor. The third voltage $(V_3)$ is provided by the second capacitance. The output current $(I_{out})$ is exponentially related to the fourth voltage difference $(V_3-V_{REF})$. As defined, the sum of the first $(V_1-V_{REF})$ and third $(V_3-V_2)$ voltage differences equals the sum of the second $(V_1-V_2)$ and fourth $(V_3-V_{REF})$ voltage differences. Therefore, because of the exponential relation between the currents and the voltage differences, the product of the first $(I_a)$ and third $(I_c)$ input currents must equal the product of the second input current $(I_b)$ and the output current $(I_{out})$.

Although the operation of the TCM has been described in three operational stages, the first and third operational stages are not mutually exclusive. The first operational stage generates the first voltage $(V_1)$ and the third operational stage uses the third voltage $(V_3)$, so the first and second transistors operate independently. Therefore, the first and third stages of operation can occur concurrently, and can be combined into a single operational stage. This results in a pipelined TCM with two operational pipelined stages. During the first pipelined operational stage, the TCM is configured as for both the first and third non-pipelined operational stages. During the second operational pipelined stage, the TCM is configured as for the second non-pipelined operational stage. The pipelined TCM will produce a new output current $(I_{out})$ every other operational pipelined stage, but the delay required to update the output current $(I_{out})$ after a change in the first input current $(I_a)$ is still two operational stages (as in the non-pipelined TCM).

Referring now to FIG. 1A, FIG. 1A shows an embodiment of a two branch continuous time translinear current multiplier (TCM) 100. TCM 100 has an input branch 102 and an output branch 108. The input branch 102 has two matched NFETs: first NFET (104) and second NFET (106). The output branch 108 also has two matched NFETs: third NFET (110) and fourth NFET (112). The input branch 102 receives a first input current $(I_a)$ and a second input current $(I_b)$. The output branch 108 receives a third input current $(I_c)$ and generates an output current $(I_{out})$.

$I_a$ generates a voltage of $V_1$ from the input voltage $V_{REF}$ through the feedback connection between the gate terminal of the first NFET (104) and the drain terminal of the first NFET (104). $I_b$ generates a voltage of $V_2$ from voltage $V_1$ at the source terminal of the second NFET (106). $I_c$ generates a voltage of $V_3$ from $V_2$ through the feedback connection between the gate terminal of the third NFET (110) and the drain terminal of the third NFET (110). The source terminals of the first NFET (104) and the fourth NFET (112) are coupled to a common input voltage source $(V_{REF})$. $V_{GS}^{Q1}=V_1-V_{bias} V_{DS}^{Q1}=V_1-V_{bias} V_{GS}^{Q2}=V_1-V_2 V_{DS}^{Q2}=-V_2 V_{GS}^{Q3}=V_3-V_2 V_{DS}^{Q3}=V_3-V_2 V_{GS}^{Q4}=V_3-V_{bias} V_{DS}^{Q4}=V_{out}-V_{bias}$ As shown in FIG. 1A, $V_1$ is the gate terminal voltage of both the first NFET (104) and the second NFET (106). $V_2$ is the source terminal voltage of both the second NFET (106) and the third NFET (110). $V_3$ is the gate terminal voltage of both the third NFET (110) and the fourth NFET (112). That is, for the first NFET (104), $V_{GS1}=V_1-V_{REF}$. For the second NFET (106), $V_{GS2}=V_1-V_2$. For the third NFET (110), $V_{GS3}=V_3-V_2$. For the fourth NFET (112), $V_{GS4}=V_3-V_{REF}$. Note that as shown in FIG. 1A, $I_c$ is provided both above and below the third NFET (110), whereas $I_b$ is provided only below the second NFET (106). This is to make clear that $I_b$ is the current that flows through the second NFET (106) only. However, in some embodiments, $I_b$ and the lower $I_c$ are combined into a single current $I_x$, where $I_x=I_b+I_c$, and the current that flows through the second NFET (106) is then $I_x-I_c$.

When FETs are operated in the sub-threshold regime, there is an exponential relationship between $I_{DS}$ the gate-source voltage ($V_{GS}$) and the drain-source current ($I_{DS}$), e.g., $I_{DS} \propto \alpha \cdot e^{\beta \cdot V_{GS}}$. Thus, a FET may be employed to exponentially transform a voltage (e.g., $V_{GS}$) into a current (e.g., $I_{DS}$), or through the use of a feedback loop, logarithmically transform a current (e.g., $I_{DS}$) into a voltage (e.g., $V_{GS}$). Thus, the first NFET (104) to logarithmically converts $I_a$ to the voltage difference $V_{GS1}=V_1-V_{REF}$. The second NFET (106) logarithmically converts $I_b$ to the voltage difference $V_{GS2}=V_1-V_2$. The third NFET (110) logarithmically converts $I_c$ to the voltage difference $V_{GS3}=V_3-V_2$. The fourth NFET (112) operates in the inverse in that it exponentially converts the voltage difference $V_{GS4}=V_3-V_{REF}$ to $I_{out}$.

Although not shown explicitly in FIG. 1A, the three input currents and the output current are flowing through a common closed loop, and each of the currents is flowing through a separate translinear element (e.g., NFETs 104, 106, 110 and 112). The first NFET (104) and the third NFET (110) are arranged in a counterclockwise (CCW) orientation in the loop and the second NFET (106) and the fourth NFET (112) are arranged in a CW orientation of the loop. Thus, $I_a$ and $I_c$ are CCW currents and $I_b$ and $I_{out}$ are CW currents. Based on Kirchhoff's current and voltage laws for a closed loop, and the exponential relationships between current and voltage, the translinear principle requires that the product of the CCW currents and the product of the CW must be equivalent. Thus, as indicated in FIG. 1A, $$I_{out} = \frac{I_a \cdot I_c}{I_b}.$$

Figure 1B:
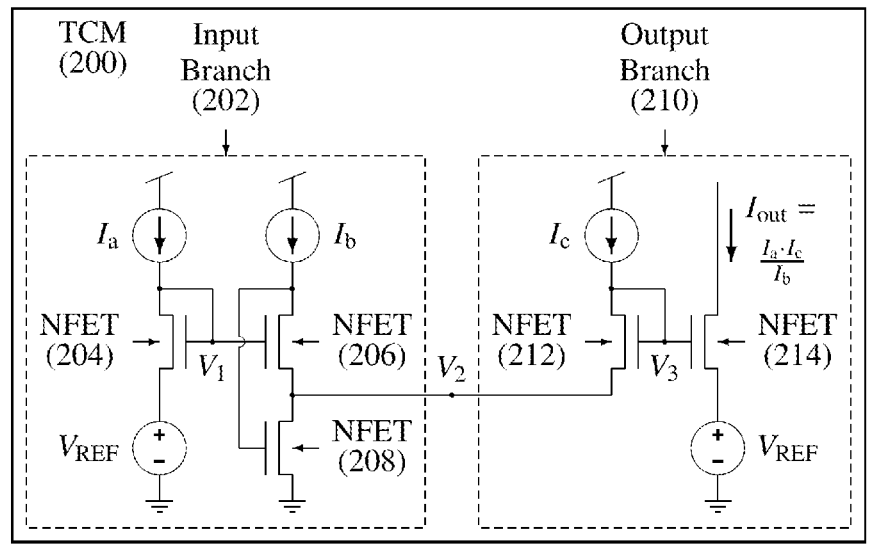
FIG. 1B shows another embodiment of a continuous time two branch translinear current multiplier, using an alternate biasing scheme.

FIG. 1B shows another embodiment of a TCM, with an alternative biasing scheme. Instead of applying $I_b$ to the source terminal of the second NFET (106) as in FIG. 1A, $I_b$ is applied to the drain terminal of the second NFET (206) in FIG. 1B. To ensure that $I_b$ will flow in the second NFET (206) and that $I_c$ will flow in the third NFET (212), a bias NFET (208) provides a current sink for the source terminals of the second NFET (206) and third NFET (212). The gate terminal of bias NFET (208) is controlled by $I_b$ through a feedback connection to the drain terminal of the second NFET (206). In contrast to the embodiment shown in FIG. 1A, this embodiment has only one input $I_c$, provided above the third NFET (212).

Figure 1C:
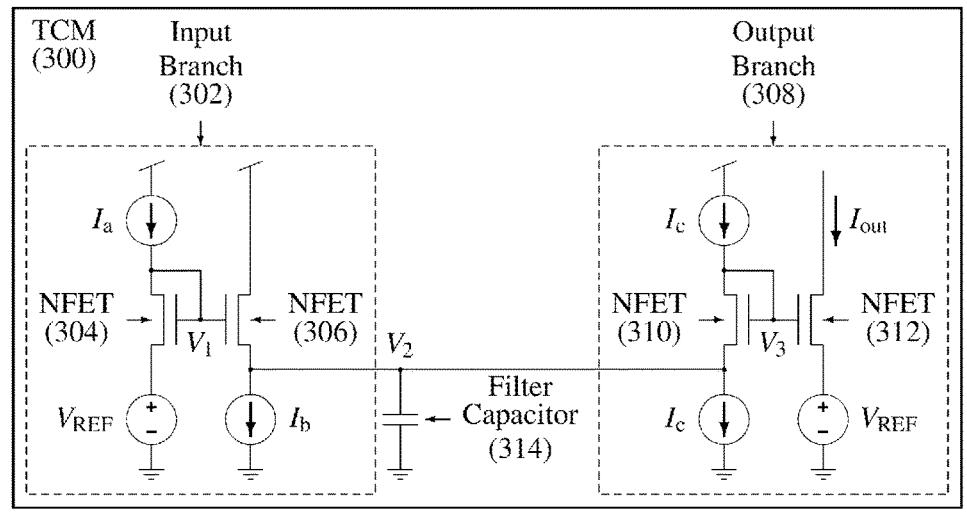
FIG. 1C shows an embodiment of a continuous time two branch translinear current multiplier incorporating a low-pass filter feature.

FIG. 1C shows another embodiment of a TCM, incorporating a low-pass filter feature. This embodiment is similar to the embodiment of FIG. 1A, with the addition of a filter capacitor connected between $V_2$ and ground (or another fixed voltage). This results in a low-pass filter between $I_a$ and $I_{out}$, with the cut-off frequency controlled by $I_b$ (i.e., independent of $I_a$). The current gain of the circuit is controlled by the ratio of $I_c$ to $I_b$. For this embodiment, $I_a$ is considered the input signal to be filtered and $I_{out}$ is the filtered output. $I_b$ and $I_c$ are control signal that may be constant. This embodiment shows that TCMs can be used for other purposes than just multiplying currents.

Figure 1D:
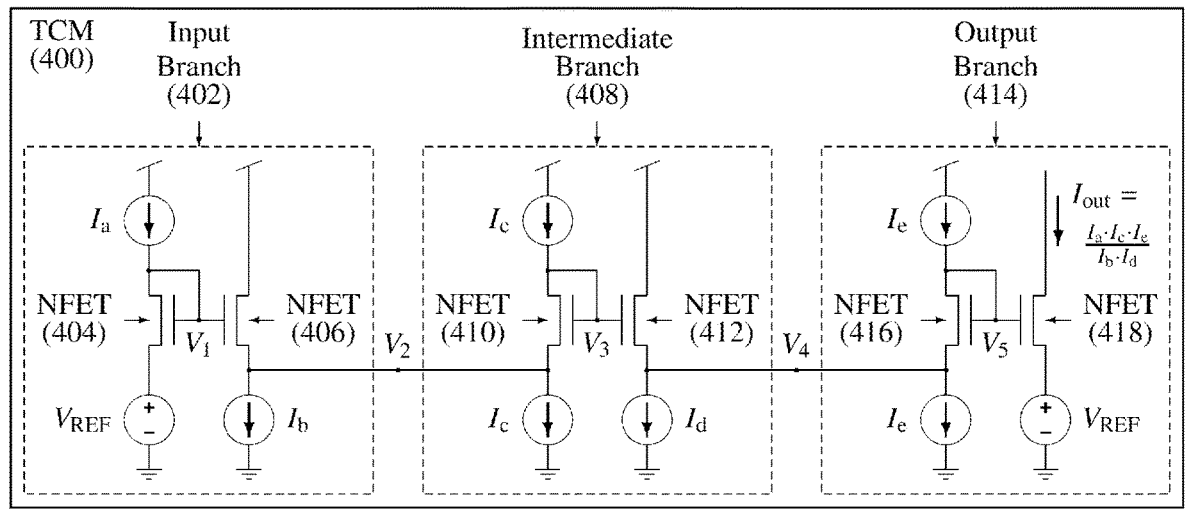
FIG. 1D shows an embodiment of a continuous time three branch translinear current multiplier.

The TCMs of the various embodiments are scalable, such that more than two branches may be included for additional multiplications and/or divisions of the input currents. FIG. 1D shows an embodiment of a three branch continuous time translinear current multiplier (TCM) 400. TCM 400 has a similar design to TCM 100 of FIG. 1A, with the addition of an intermediate branch (408) positioned between the input branch (402) and the output branch (414). Similar to TCM 100, each branch has two matched NFETs. More particularly, the input branch (402) has two matched NFETs: 404 and 406, where NFET 404 is a CCW NFET and NFET 406 is a CW NFET. The intermediate branch 408 has two matched NFETs: 410 and 412, where NFET 410 is a CCW NFET and NFET 412 is a CW NFET. The output branch 414 has two matched NFETs: 416 and 418, where NFET 416 is a CCW NFET and NFET 418 is a CW NFET.

The input branch (402) receives the CCW input current $I_a$ and the CW input current $I_b$, where $I_a$ flows through NFET 404 and $I_b$ flows through NFET 406. The intermediate branch (408) receives the CCW input current $I_c$ and the CW input current $I_d$, where $I_c$ flows through NFET 410 and $I_d$ flows through NFET 412. The output branch (414) receives the CCW input current $I_e$ and generates the CW output current $I_{out}$, where $I_e$ flows through NFET 416 and $I_{out}$ flows through NFET 418. $I_a$ has a corresponding voltage difference: $V_1-V_{REF}$. $I_b$ has a corresponding voltage difference: $V_1-V_2$. $I_c$ has a corresponding voltage difference: $V_3-V_2$. $I_d$ has a corresponding voltage difference: $V_3-V_4$. $I_e$ has a corresponding voltage difference: $V_5-V_4$. $I_{out}$ has a corresponding voltage difference: $V_5-V_{REF}$. The input voltage $V_{REF}$ is also shown. Connections to ground are also shown in FIG. 1D. Based on the device physics discussed in conjunction with TCM 100, $$I_{out} = \frac{I_a \cdot I_c \cdot I_e}{I_b \cdot I_d}.$$

Figure 2A:
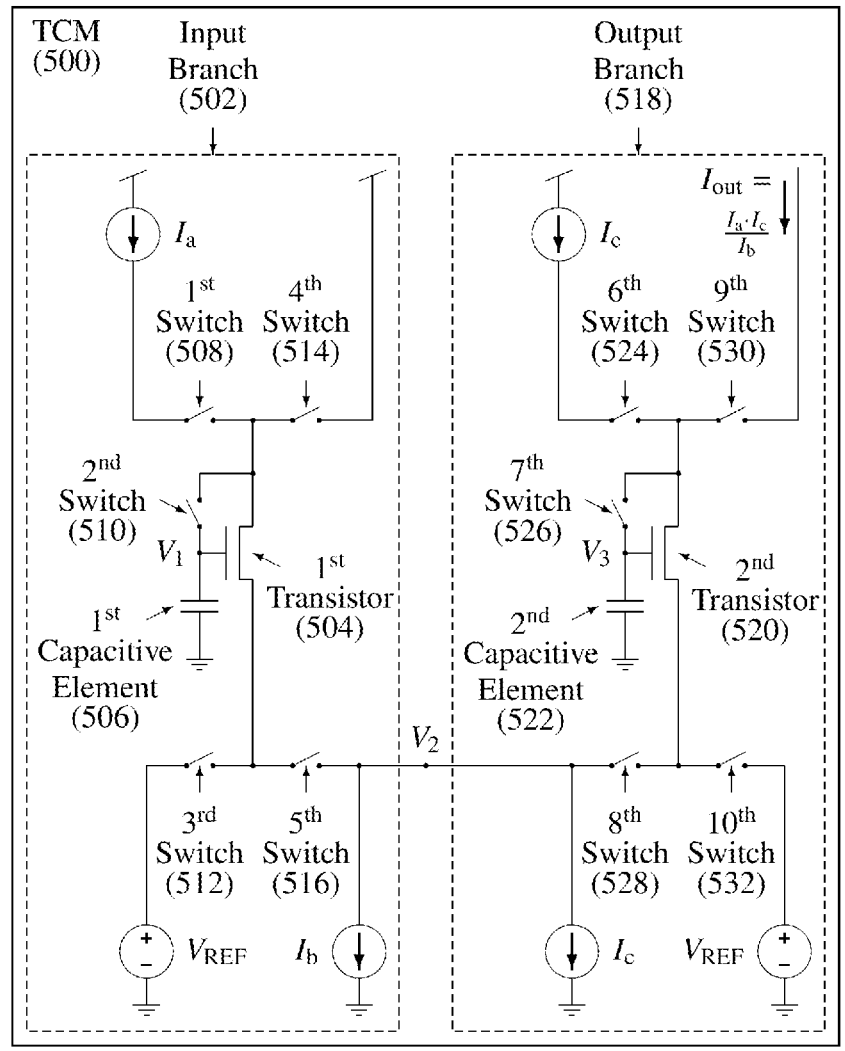
FIG. 2A shows an embodiment of a discrete time two branch dynamic translinear current multiplier.
Figure 2D:
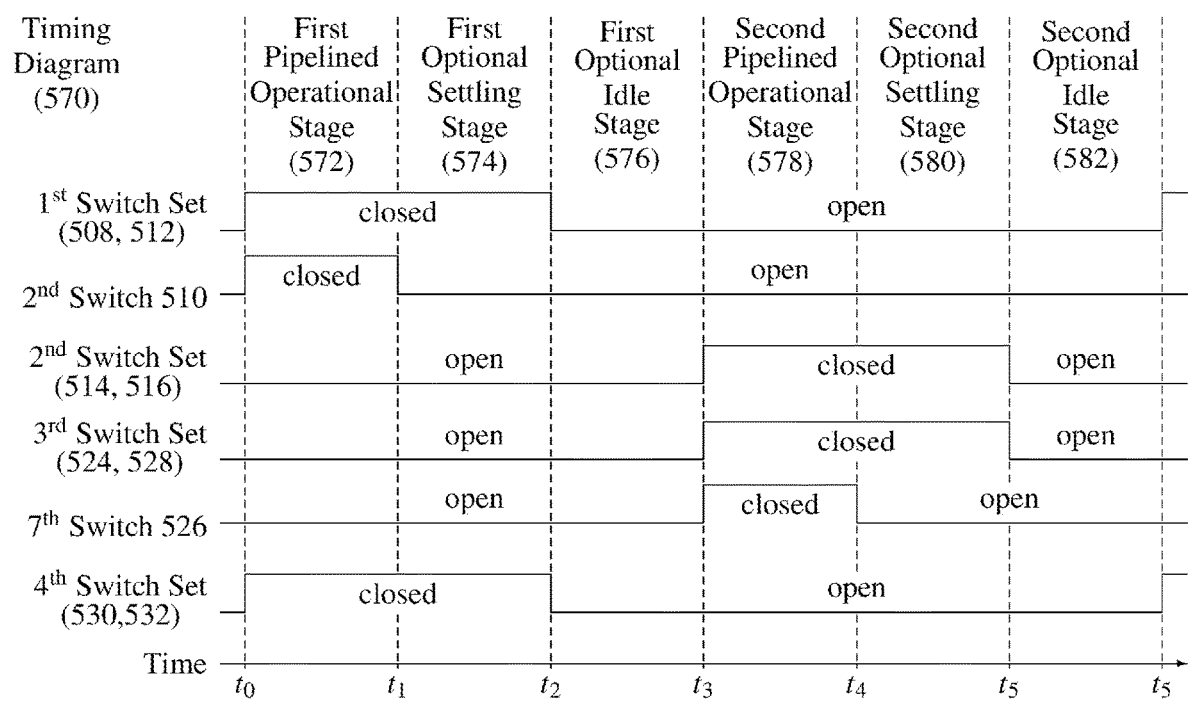
FIG. 2D shows a timing diagram for the cyclic pipelined operation of the translinear current multiplier of FIG. 2A, with additional optional stages, according to various embodiments.

Turning attention to FIGS. 2A-2D, FIG. 2A shows an embodiment of a two branch dynamic translinear current multiplier (TCM) 500. TCM 500 is operated synchronously via three operational stages or two pipelined operational stages (when overlapping the first and third operational stages). The stages are cyclic. FIG. 2B shows a non-pipelined timing diagram 550 for the cyclic and synchronous operation of the TCM 500 of FIG. 2A, according to various embodiments. FIG. 2C shows a pipelined timing diagram 560 for the cyclic and synchronous operation of the TCM 500 of FIG. 2A, according to various embodiments. FIG. 2D shows a pipelined timing diagram 570 with optional stages for the cyclic and synchronous operation of the TCM 500 of FIG. 2A, according to various embodiments. FIGS. 2A, 2B, 2C, and 2D will be discussed in conjunction with one another. Similar to TCM 100 of FIG. 1A, TCM 500 has an input branch 502 and an output branch 518. However, rather than having two matched transistors, each branch of TCM 500 has only a single transistor. Furthermore, each branch of TCM 500 has a capacitive element and a set of control switches. The control switches of each branch are employed to transition states of the TCM between its operational stages. As discussed below, in the first operational stage, the dynamic TCM 500 is in a first operational state. In the second operational stage, the dynamic TCM 500 is in a second operational state. In the third operational stage, the dynamic TCM 500 is in a third operational state. In the pipelined operation of TCM 500, the first and third operational states occur simultaneously. Thus, the dynamic TCM 500 may be operated as an analog state machine that synchronously loops over its states. The state of the dynamic TCM 500 may be characterized by the states of the sets of switches for each branch. Having only a single transistor in each branch, the design of the dynamic TCM 500 obviates the requirement of matching transistors.

More particularly, input branch 502 has a first transistor 504, a first capacitive element 506, and two sets of switches. The first set of switches includes the first switch 508, the second switch 510, and the third switch 512. The second set of switches includes the fourth switch 514, and the fifth switch 516. Similarly, the output branch 518 has a second transistor 520, a second capacitive element 522, and another two sets of switches. The third set of switches includes the sixth switch 524, the seventh switch 526, and the eighth switch 528. The fourth set of switches includes the ninth switch 530, and the tenth switch 532. Similar to continuous time TCM 100, dynamic TCM 500 receives a first input current ($I_a$), a second input current ($I_b$), and a third input current ($I_c$). TCM 500 also receives an input voltage ($V_{REF}$). In response, to receiving its inputs (and being operated in its cyclic stages or states), TCM 500 generates an output current ($I_{out}$), where $$I_{out} = \frac{I_a \cdot I_c}{I_b}.$$

Note that the first capacitive element 506 and the second capacitive element 522 are shown as discrete capacitor devices in FIG. 2A. However, the embodiments are not so limited, and each of the first capacitive element 506 and the second capacitive element 522 may be (or include) parasitic capacitive elements of the circuitry of the TCM 500. In some embodiments, whether the capacitive elements are discrete devices or parasitic capacitances, the effective capacitance of the capacitive elements may be increased by employing a Miller amplifier (e.g., a voltage inverting amplifier) and/or the Miller effect as described in XYZ, the contents of which are incorporated in their entirety herein. INCORPORATE NOC-104 HERE. By employing a Miller amplifier and/or the Miller effect, the physical footprint of the capacitive elements may be decreased and/or the performance of the circuit improved. Accordingly, real estate on an integrated chip may be utilized more efficiently.

Also similar to TCM 100, the first and third input currents may be counterclockwise (CCW) currents, while the second input current and the output current may be clockwise (CW) currents. The first input current ($I_a$) may be associated with a first voltage difference $V_1-V_{REF}$. The second input current ($I_b$) may be associated with a second voltage difference $V_1-V_2$. The third input current ($I_c$) may be associated with a third voltage difference $V_3-V_2$. The output current ($I_{out}$) may be associated with a fourth voltage difference $V_3-V_{REF}$.

In some embodiments, the first transistor 504 and the second transistor 520 are field effect transistors (FETs). Accordingly, the first transistor 504 has a first drain terminal coupled to the first switch 508 and the fourth switch 514. The first transistor 504 has a first source terminal coupled to the third switch 512 and the fifth switch 516. The first transistor 504 has a first gate terminal coupled to the second switch 510 and a first terminal of the first capacitive element 506. The second terminal of the first capacitive element 506 is coupled to a ground source or another fixed voltage. The second transistor 520 has a second drain terminal coupled to the sixth switch 524 and the ninth switch 530. The second transistor 520 has a second source terminal coupled to the eighth switch 528 and the tenth switch 532. The second transistor 520 has a second gate terminal coupled to the seventh switch 526 and a first terminal of the second capacitive element 522. The second terminal of the second capacitive element 522 is coupled to a ground source or another fixed voltage.

The first switch 508 selectively couples a source of the first input current $I_a$ and the drain terminal of the first transistor 504. The second switch 510 selectively couples the drain terminal of the first transistor 504 and the gate terminal of the first transistor 504, as well as the first terminal of the first capacitive element 506. The third switch 512 selectively couples the input voltage $V_{REF}$ to the source terminal of the first transistor 504. The fourth switch 514 selectively couples a supply voltage and the drain terminal of the first transistor 504. The fifth switch 512 selectively couples a source of the second input current $I_b$ and the source terminal of the first transistor 504.

The sixth switch 524 selectively couples a source of the third input current $I_c$ and the drain terminal of the second transistor 520. The seventh switch 526 selectively couples the drain terminal of the second transistor 520 and the gate terminal of the second transistor 520, as well as the first terminal of the second capacitive element 522. The eighth switch 528 selectively couples another source of the third input current $I_c$ to the source terminal of the second transistor 520. The ninth switch 530 selectively couples an output terminal, which transmits the output current, and the drain terminal of the second transistor 520. The tenth switch 532 selectively couples the input voltage $V_{REF}$ and the source terminal of the second transistor 520.

Turning attention to FIG. 2B, the timing diagram 550 of FIG. 2B shows one embodiment of the non-pipelined sequencing of the switches in TCM 500. To simplify the diagram, the switches are grouped into four sets. Each switch in a set of switches can be operated simultaneously with the other switches in the set, so that all switches in a set are closed (e.g., conducting or transmitting) at the same time or open (e.g., non-conducting or non-transmitting) at the same time. In other embodiments, the opening or closing time of one or more switches in a set can be delayed from the others to improve the circuit's performance. The first switch set contains switches 508, 510, and 512 from TCM 500. The second switch set contains switches 514, and 516. The third switch set contains switches 524, 526, and 528. The fourth switch set contains switches 530 and 532. In timing diagram 550, TCM 500 has three operational stages: first operational stage 552, second operational stage 554, and third operational stage 556. The boundaries between the stages are shown via the vertical dashed lines. Two synchronous cycles of the three operational stages are shown in timing diagram 550. Note that in the various embodiments the "temporal width" (both relative and absolute) of each of the operational stages may vary from that shown in FIG. 2B.

The timing diagram 550 of FIG. 2B indicates the state of each of the switches during each operational stage, according to various embodiments. When a switch is in the open state, the switch is non-conducting (or non-transmitting), while when the switch is in the closed state, the switch is conducting (or transmitting). For example, in FIG. 2A, each of the ten switches in TCM 500 is shown in the open state. Thus, by defining the state of each switch in each of the operational stages, timing diagram 550 defines the operational states of TCM 500. Each of the switches may be implemented by one or more transistors (e.g., a FET). Thus, transistors implementing switches may be operated as binary switches, while the first transistor 504 and the second transistor 520 are operated in their sub-threshold (or translinear) region.

Various functionalities of the closed (and open) switches are now summarized for the three non-pipelined operational stages. In the first operational stage 552, the first switch 508 is configured in the closed state such that at least a portion of the first input current ($I_a$) is provided to the drain terminal of the first transistor 504. The third switch 512 is configured in the closed state such that the input voltage $V_{REF}$ is provided to the source terminal of the first transistor 504. The second switch 510 is configured in the closed state to provide a feedback path between the gate terminal and the drain terminal of the first transistor 504, such that the voltage difference $V_1-V_{REF}$ between the gate terminal voltage ($V_1$) and the source terminal voltage ($V_{REF}$) corresponds to the first input current ($I_a$). The first voltage $V_1$ is also provided to the first terminal of the first capacitive element 506, as it is also connected to the gate terminal of the first transistor 504. As shown in FIG. 2A, the second terminal of the first capacitive element 506 is coupled to a ground source (or another fixed voltage source). Thus, during the first stage 552, the first capacitive element 506 is charged to a first charged state that stores a potential equivalent to the first voltage ($V_1$).

Thus, in some embodiments, during the first operational stage 552, the $V_D=V_1$, $V_S=V_{bias}$, $V_G=V_1$, $V_{DS}=(V_1-V_{bias})$, $\triangle V_{GS}=(V_1-V_{bias})V_G$ first capacitive element 506 is charged to the first voltage ($V_1$), via the first input current ($I_a$). That is, at least a portion of the first input current ($I_a$) flows to the first capacitive element 506 to generate the first charged state of the first capacitive element 506. In at least some embodiments, another portion of the first input current ($I_a$) may flow through the first transistor 504, during the first operational stage 552. Due to the sub-threshold (or translinear) operation of the first transistor 504, the first voltage difference $V_1-V_{REF}$ may be logarithmically related to the first input current $I_a$.

$$V_D=V_{out}, V_S=V_{bias}, V_G=V_3, V_{DS}=(V_{out}-V_{bias}), \triangle V_{GS}=(V_3-V_{bias})V_G V_{out} V_{GS}=(V_3-V_{bias})$$

$$V_D=V_1, V_S=V_{bias}, V_G=V_1, V_{DS}=(V_1-V_{bias}), \triangle V_{GS}=(V_1-V_{bias})V_G V_{GS}=(V_1-V_{bias})$$

$$V_D=V_{out}, V_S=V_{bias}, V_G=V_3, V_{DS}=(V_{out}-V_{bias}), \triangle V_{GS}=(V_3-V_{bias})V_G$$

During the second operational stage 554, the fifth switch 516 is configured in a closed state such that the second input current ($I_b$) is provided to the source terminal of the first transistor 504. The fourth switch 514 is configured in a closed state such that the drain terminal of the first transistor 504 is connected to a power supply, allowing the second input current ($I_b$) to flow through the first transistor 504. As with all the switches in the first set, the second switch 510 is configured in an open state. Therefore, the first charged state of the first capacitive element 506 provides the first voltage $V_1$ to the gate terminal of the first transistor 504 while keeping the gate terminal of the first transistor 504 isolated from the first input current $I_a$ and the second input current $I_b$.

Thus, in some embodiments, during the second operational stage 554, the first transistor 504 $V_S=V_2$, $V_G=V_1$, $\triangle V_{GS}=(V_1-V_2)$ has voltage $V_1$ at the gate terminal, where $V_1$ is provided by the first charged state of the first capacitive element 506. In at least some embodiments, the second input current $I_b$ may flow through the first transistor 504, during the second operational stage 554. When the second input current $I_b$ flows through the first transistor 504, the first transistor 504 effectively converts the second input current $I_b$ into a second voltage difference $V_{GS}=(V_1-V_2) V_1-V_2$. Due to the sub-threshold (or translinear) operation of the first transistor 504, the second voltage difference $V_1-V_2$ may be logarithmically related to the second input current $I_b$.

Also in the second operational stage 554, the sixth switch 524 is configured in a closed state such that at least a portion of the third input current $I_c$ is provided to the drain terminal of the second transistor 520. The eighth switch 528 is configured in the closed state such that the second voltage $V_2$ is provided to the source terminal of the second transistor 520. The seventh switch 526 is configured in the closed state to provide a feedback path between the gate terminal and the drain terminal of the second transistor 520, such that the voltage difference $V_3-V_2$ between the gate terminal voltage ($V_3$) and the source terminal voltage ($V_2$) corresponds to the third input current ($I_c$). The third voltage $V_3$ is also provided to the first terminal of the second capacitive element 522, as it is also connected to the gate terminal of the second transistor 520. As shown in FIG. 2A, a second terminal of the second capacitive element 522 is coupled to a ground source (or another fixed voltage source). Thus, as noted above, during the second operational stage 554, the second capacitive element 522 is charged to a second charged state that stores a potential equivalent to the third voltage ($V_3$).

Thus, in some embodiments, during the second operational stage 554, the $V_D=V_3$, $V_S=V_2$, $V_G=V_3$, $\triangle V_{GS}=(V_3-V_2) V_G$ second capacitive element 522 is charged to the third voltage ($V_3$), via the third input current ($I_c$). That is, at least a portion of the third input current ($I_c$) flows to the second capacitive element 522 to generate the second charged state of the second capacitive element 522. In at least some embodiments, another portion of the third input current ($I_c$) may flow through the second transistor 520, during the second operational stage 554. Due to the sub-threshold (or translinear) operation of the second transistor 520, the third voltage difference $V_3-V_2$ may be logarithmically related to the third input current $I_c$.

In the third operational stage 556, the tenth switch 532 is configured in a closed state such that the input voltage $V_{REF}$ is provided to the source terminal of the second transistor 520. The ninth switch 530 is configured in the closed state such that the current through the second transistor is transmitted as the output current $I_{out}$. As with all the switches in the third set, the seventh switch 526 is configured in an open state. Therefore, the second charged state of the second capacitive element 522 provides the third voltage $V_3$ to the gate terminal of the second transistor 520 while keeping the gate terminal of the second transistor 520 isolated from the third input current $I_c$ and the output current $I_{out}$.

Thus, in some embodiments, during the third operational stage 556, the second transistor 520 $V_S=V_2$, $V_G=V_1$, $\triangle V_{GS}=(V_1-V_2)$ has voltage $V_3$ at the gate terminal, where $V_3$ is provided by the second charged state of the second capacitive element 522. The second transistor also has input voltage $V_{REF}$ at the source terminal. In at least some embodiments, the output current $I_{out}$ may flow through the second transistor 520, during the third operational stage 556. When the output current $I_{out}$ flows through the second transistor 520, the second transistor effectively converts the $V_{GS}=(V_1-V_2)$ fourth voltage difference $V_3-V_{REF}$ to the output current $I_{out}$. Due to the sub-threshold (or translinear) operation of the second transistor 520, the fourth voltage difference may be logarithmically related to the output current $I_{out}$.

$V_D=V_3, V_S=V_2, V_G=V_3, \wedge V_{GS}=(V_3-V_2) V_G V_{GS}=(V_3-V_2)$

Turning attention to FIG. 2C, the timing diagram 560 of FIG. 2C shows one embodiment of the pipelined sequencing of the switches in TCM 500. As with timing diagram 550 of FIG. 2B, the switches in TCM 500 have been grouped into the same four sets of switches to simplify the diagram. In timing diagram 560, TCM 500 has two pipelined operational stages: the first pipelined operational stage 562 and the second pipelined operational stage 564. The boundaries between the stages are shown via the vertical dashed lines. Three synchronous cycles of the two pipelined stages are shown in timing diagram 560. As with timing diagram 550 of FIG. 2B, in the various embodiments the "temporal width" (both relative and absolute) of each of the pipelined operational stages may vary from that shown in FIG. 2C.

The first pipelined operational stage 562 of timing diagram 560 of FIG. 2C is a combination of the first operational stage 552 and the third operational stage 556 of timing diagram 550 of FIG. 2B. That is, all the switches that are closed in the first and third operational stages (552 and 556) of timing diagram 550 are also closed during the first pipelined operational stage 562 of timing diagram 560.

The merging of the first and third operational stages (552 and 556) of timing diagram 550 into a single pipelined operational stage 562 is possible, because none of the switches in the second or third switch sets are closed, such that the input branch 502 and the output branch 518 of TCM 500 are operating independently. Specifically, the fifth switch 516 and the eighth switch 528 are the only switches linking the two branches, and they are both open during the first and third operational stages (552 and 556) of timing diagram 550.

The second pipelined operational stage 564 of timing diagram 560 of FIG. 2C is functionally identical to the second operational stage 554 of timing diagram 550 of FIG. 2B. That is, the same set of switches are closed in both cases.

When TCM 500 is operated according to timing diagram 550 of FIG. 2B, the output current $I_{out}$ is only available during the third operational stage 556, and not during the first operational stage 552 or the second operational stage 554. When TCM 500 is operated according to timing diagram 560 of FIG. 2C, the output current $I_{out}$ is only available during the first pipelined operational stage 562, and not during the second pipelined operational stage 564. Therefore, the pipelined operation of TCM 500 increases the duty cycle of the output current $I_{out}$ from one in three operational stages to one in two pipelined operational stages. When TCMs are constructed with additional intermediate branches, the pipelined operation always has only two pipelined operational stages, whereas the non-pipelined operation increases by one operational stage for every intermediate branch added to the TCM. Thus, the duty cycle improvement with pipelining becomes even more significant with additional intermediate branches. Other benefits of pipelining, such as reduced control logic complexity, are also possible.

It will be apparent to those skilled in the art that the operational stages (both non-pipelined and pipelined) described in timing diagrams 550 and 560 are only the minimum necessary for the functional operation of TCM 500, and that numerous optimizations or improvements are possible. For instance, the timing diagrams show that the states of some switches are mutually exclusive (such as those in the first and second switch sets). However, reliable operation may require the insertion of optional idle stages where all switches are open, as this is preferable to having mutually exclusive switches closed simultaneously at any time. The timing diagrams also show that the state of switches in a set is the same, so that all switches should open (or close) at the same time. However, reliable operation may require the insertion of optional settling stages where some switches open before others in the set, as this is preferable to the order being reversed. This is illustrated in timing diagram 570 of FIG. 2D.

In FIG. 2D, the timing diagram 570 shows another embodiment of the pipelined sequencing of the switches in TCM 500. As with the timing diagrams of FIGS. 2B and 2C, in the various embodiments the "temporal width" (both relative and absolute) of each of the pipelined operational stages may vary from that shown in FIG. 2D. Timing diagram 570 includes first optional idle stage 576 and second optional idle stage 582, during which all switches are open to ensure that there is no overlap between mutually exclusive switches. Timing diagram 570 also includes first optional setling stage 574, which differs from the first pipelined operational stage 572 in that the second switch 510 is open. Opening first switch 508 and/or third switch 512 disrupts the flow of the first input current $I_a$ through the first transistor 504, which can cause a perturbation of the gate terminal voltage of the first transistor 504, and hence a perturbation of the first stored voltage $V_1$. Opening the second switch 510 before either the first switch 508 or the third switch 512 may reduce the perturbations of the first stored voltage $V_1$. Similarly, timing diagram 570 also includes second optional setling stage 580, which differs from the second pipelined operational stage 578 in that the seventh switch 526 is open. Opening the seventh switch 526 before either the sixth switch 524 or the eighth switch 528 may reduce the perturbations of the third stored voltage $V_3$.

It will also be apparent to those skilled in the art that the switches shown in the FIG. 2A are the minimum necessary for the functional operation of TCM 500 according to the timing diagrams of FIGS. 2B, 2C, and 2D, and that numerous optimizations or improvements are possible. For example, the fifth switch 516 and the eighth switch 528 are connected in series and are closed simultaneously during the second pipelined operational stage 564. Therefore the fifth switch 516 and the eighth switch 528 could be combined into a single switch. For another example, during the first pipelined operational stage 562 of timing diagram 560, the second voltage $V_2$ is not driven by the first transistor 504 of TCM 500. Therefore, input currents $I_b$ and $I_c$ may temporarily cause $V_2$ to go down, increasing the time required for $V_2$ to settle in the following second pipelined operational stage. Additional switches can mitigate this effect by disconnecting or turning off the input currents $I_b$ and $I_c$ during the first pipelined operational stage 562.

It will also be apparent to those skilled in the art that various buffers and amplifiers (both current and voltage) may be added to TCM 500 to improve performance. For example, the drain terminal and gate terminal of the first transistor 504 may be connected via an amplifier and a switch instead of only a switch. For another example, the first transistor 504 may have a cascode transistor at its drain terminal to buffer the drain current.

It will also be apparent to those skilled in the art that whereas the transistors in TCM 100 of FIG. 1A need not be the same size (e.g., if a multiplicative constant in the output current relation to the input currents is desired), the same effect can be achieved in TCM 500 of FIG. 2A via additional switches and/or transistors.

Figure 3A:
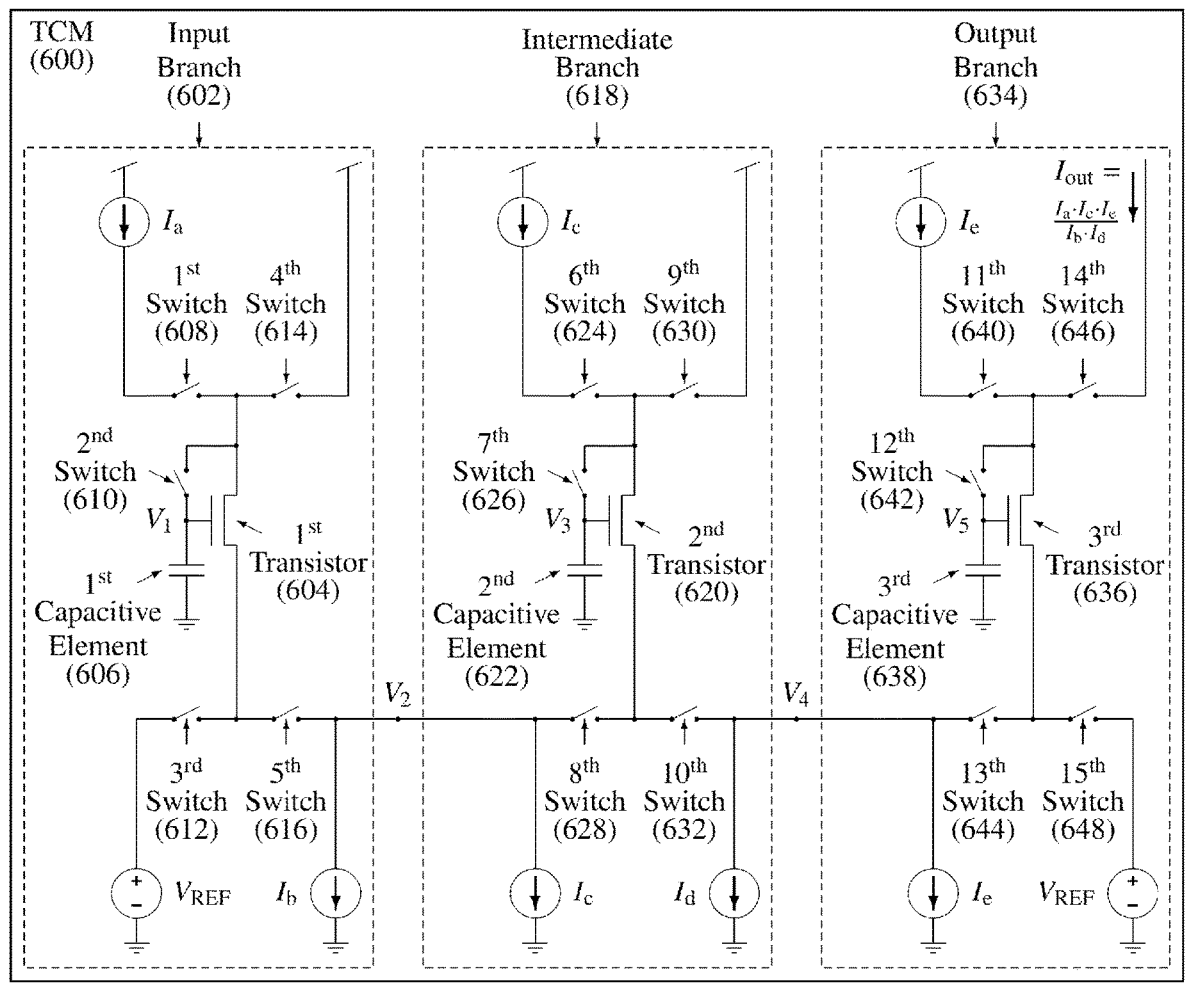
FIG. 3A shows an embodiment of a discrete time three branch dynamic translinear current multiplier.
Figure 3B:
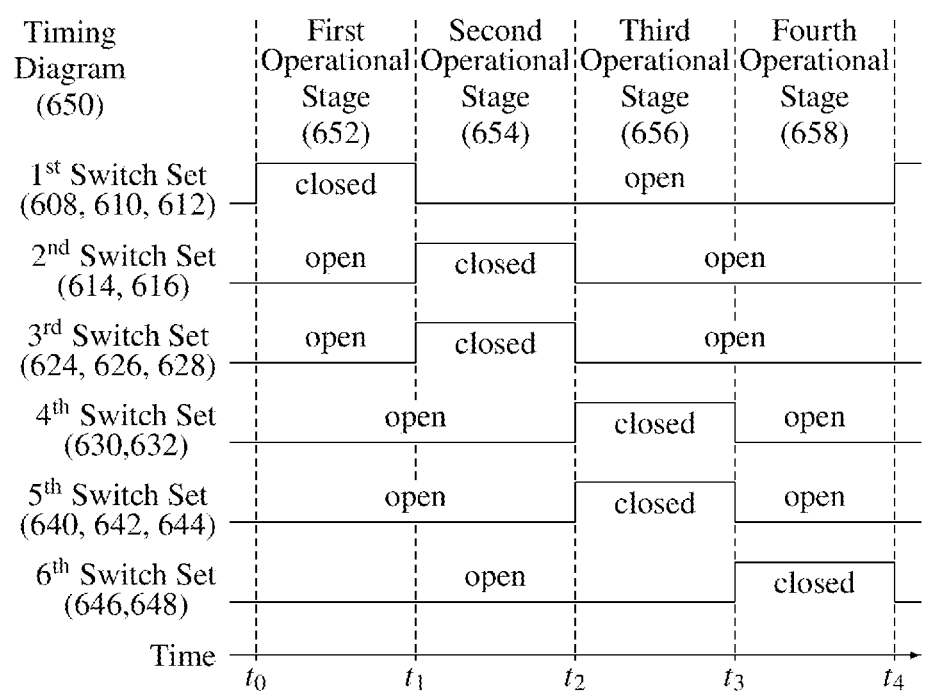
FIG. 3B shows a timing diagram for the cyclic (and non-pipelined) operation of the translinear current multiplier of FIG. 3A, according to various embodiments.
Figure 3C:
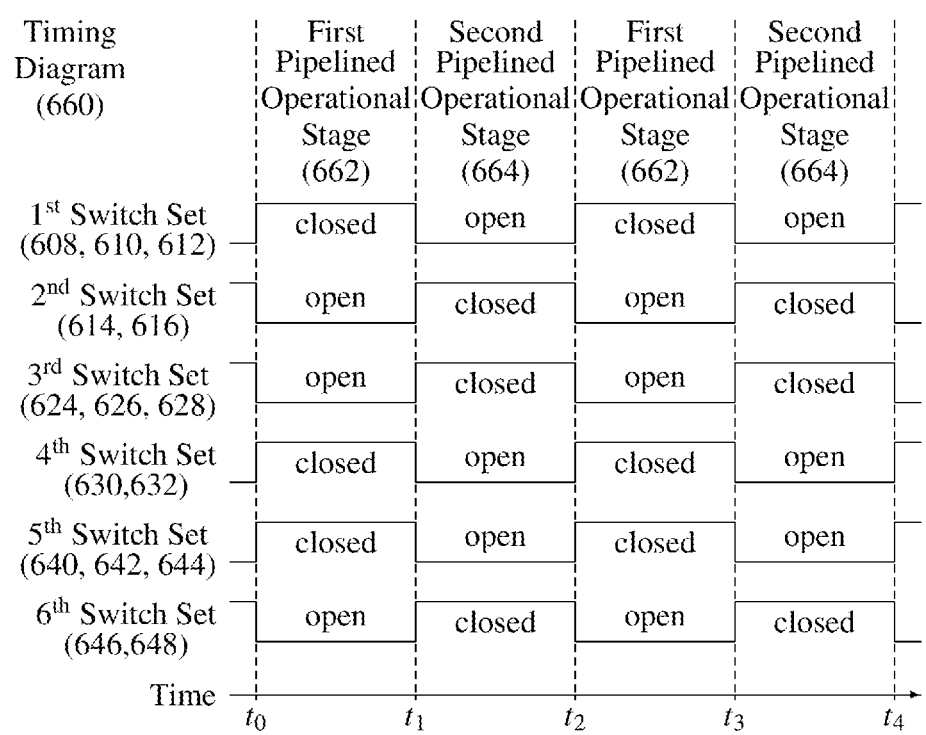
FIG. 3C shows a timing diagram for the cyclic pipelined operation of the translinear current multiplier of FIG. 3A, according to various embodiments.

Turning attention to FIGS. 3A-3C, FIG. 3A shows an embodiment of a three branch dynamic translinear current multiplier (TCM) 600. FIG. 4B shows a timing diagram 650 for the cyclic (and non-pipelined) operation of the TCM 600 of FIG. 3A, according to various embodiments. FIG. 4C shows a timing diagram 660 for the cyclic pipelined operation of the TCM 600 of FIG. 3A, according to various embodiments. TCM 600 includes an input branch 602, an intermediate branch 618, and an output branch 634. FIG. 3A shows how the two branch concept of a dynamic TCM may be extended to three branches. The embodiments may similarly be extended to more than three branches. The five input currents: $I_a$, $I_b$, $I_c$, $I_d$, and $I_e$ are labelled on FIG. 3A, as well as the fifteen switches.

FIG. 3B shows a timing diagram for the cyclic operation of the TCM 600 of FIG. 3A. Timing diagram 650 shows the state of the switches for the operational stages of TCM 600. As with TCM 500, the fifteen switches of TCM 600 have been grouped into sets to simplify the timing diagram. For the non-pipelined operation, each additional intermediate branch adds an operational stage to the timing diagram. With one intermediate branch, TCM 600 has four operational stages. The first and last operational stages are the same for all dynamic TCMs. However, the operational stages involving the intermediate branch (second operational stage 654 and third operational stage 656) are changed from the second operational stage 554 of FIG. 2B, because the intermediate branches do not use the input voltage $V_{REF}$. One synchronous cycles of the two pipelined stages are shown in timing diagram 650. Note that in the various embodiments the "temporal width" (both relative and absolute) of each of the pipelined operational stages may vary from that shown in FIG. 3B.

The operational stages of FIG. 3B will now be briefly described. During the first operational stage 652 of TCM 600, the first switch 608 and the third switch 612 are closed, such that input current $I_a$ flows through the first transistor 604. The second switch 610 is also closed such that a feedback path exists between the gate and drain terminals of the first transistor 604. Therefore the first charged state of the first capacitive element 606 will be $V_1$, such that the voltage difference $V_1-V_{REF}$ corresponds to input current $I_a$.

During the second operational stage 654 of TCM 600, the fourth switch 614 and the fifth switch 616 are closed, such that input current $I_b$ flows through the first transistor 604. The first charged state of the first capacitive element 606 provides the first voltage $V_1$ to the gate terminal of the first transistor 604. The first transistor 604 generates the second voltage $V_2$, such that the voltage difference $V_1-V_2$ corresponds to input current $I_b$. Also during the second operational stage 654, the sixth switch 624 and the eighth switch 628 are closed, such that current $I_c$ flows through the second transistor 620. The seventh switch 626 is also closed such that a feedback path exists between the gate and drain terminals of the second transistor 620. Therefore the second charged state of the second capacitive element 622 will be $V_3$, such that the voltage difference $V_3-V_2$ corresponds to input current $I_c$.

During the third operational stage 656 of TCM 600, the ninth switch 630 and the tenth switch 632 are closed, such that input current $I_d$ flows through the second transistor 620. The second charged state of the second capacitive element 622 provides the third voltage $V_3$ to the gate terminal of the second transistor 620. The second transistor 620 generates the fourth voltage $V_4$, such that the voltage difference $V_3-V_4$ corresponds to input current $I_d$. Also during the third operational stage 656, the eleventh switch 640 and the thirteenth switch 644 are closed, such that current $I_e$ flows through the third transistor 636. Twelfth switch 642 is also closed such that a feedback path exists between the gate and drain terminals of the second transistor 636. Therefore the third charged state of the third capacitive element 638 will be $V_5$, such that the voltage difference $V_5-V_4$ corresponds to input current $I_e$.

During the fourth operational stage 658 of TCM 600, the fourteenth switch 646 and the fifteenth switch 648 are closed, such that output current $I_{out}$ flows through the third transistor 636. The third charged state of the third capacitive element 638 provides the fifth voltage $V_5$ to the gate terminal of the third transistor 636. The third transistor 636 generates the output current $I_{out}$ such that the output current $I_{out}$ corresponds to the voltage difference $V_5-V_{REF}$.

Due to the logarithmic relation between the currents and the voltage differences, TCM 600 generates an output current ($I_{out}$) where $$I_{out} = \frac{I_a \cdot I_c \cdot I_e}{I_b \cdot I_d}.$$

The operational stages of FIG. 3C will now be briefly described. In timing diagram 660, TCM 600 has two pipelined operational stages: the first pipelined operational stage 662 and the second pipelined operational stage 664. The boundaries between the stages are shown via the vertical dashed lines. Three synchronous cycles of the two pipelined stages are shown in timing diagram 660. As with timing diagram 650 of FIG. 3B, in the various embodiments the "temporal width" (both relative and absolute) of each of the pipelined operational stages may vary from that shown in FIG. 3C.

The first pipelined operational stage 662 of timing diagram 660 of FIG. 3C is a combination of the first operational stage 652 and the third operational stage 656 of timing diagram 650 of FIG. 3B. That is, all the switches that are closed in the first and third operational stages (652 and 656) of timing diagram 650 are also closed during the first pipelined operational stage 662 of timing diagram 660. The merging of the first and third operational stages (652 and 656) of timing diagram 650 into a single pipelined operational stage 662 is possible, because none of the switches in the second or third switch sets are closed, such that the input branch 602 and the intermediate branch 618 of TCM 600 are operating independently. Specifically, the fifth switch 616 and the eighth switch 628 are the only switches linking the two branches, and they are both open during the first and third operational stages (652 and 656) of timing diagram 650.

The second pipelined operational stage 664 of timing diagram 660 of FIG. 3C is a combination of the second operational stage 654 and the fourth operational stage 658 of timing diagram 650 of FIG. 3B. That is, all the switches that are closed in the second and fourth operational stages (654 and 658) of timing diagram 650 are also closed during the second pipelined operational stage 664 of timing diagram 660. The merging of the second and fourth operational stages (654 and 658) of timing diagram 650 into a single pipelined operational stage 664 is possible, because none of the switches in the fourth or fifth switch sets are closed, such that the intermediate branch 618 and the output branch 634 of TCM 600 are operating independently. Specifically, the tenth switch 632 and the thirteenth switch 644 are the only switches linking the two branches, and they are both open during the second and fourth operational stages (654 and 658) of timing diagram 650.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

OTHER EMBODIMENTS

Some embodiments are directed to a dynamic electrical circuit receives a first input current, a second input current, a third input current, and an input voltage. The circuit comprises an input branch and an output branch. The input branch includes a first transistor—and a first capacitive element. The output branch includes a second transistor— and a second capacitive element. The electrical circuit is configured to generate a first voltage difference associated with the first input current. The first voltage difference is a voltage difference between a first voltage and the input voltage. The first voltage is related to the first input current. The electrical circuit is configured to generate a first charged state of the first capacitive element by storing the first voltage. The electrical circuit is configured to generate a second voltage difference associated with the second input current. The second voltage difference is a voltage difference between the first voltage and a second voltage. The second voltage difference is related to the second input current. The electrical circuit is configured to generate a third voltage difference associated with the third input current. The third voltage difference is a voltage difference between a third voltage and the second voltage. The third voltage difference is related to the third input current. The electrical circuit is configured to generate an output current by providing the input voltage and the third voltage. The output current is related to a fourth voltage difference. The fourth voltage difference is the difference between the third voltage and the input voltage. A sum of the first voltage difference and the third voltage difference is equivalent to a sum of the second voltage difference and the fourth voltage difference.

In various embodiments, the first voltage difference is logarithmically related to the first input current. The second voltage difference may be logarithmically related to the second input current. The third voltage difference may be logarithmically related to the third input current. The output current may be exponentially related to the fourth voltage difference. The output current may be equivalent to a ratio of a product of the first and third input currents to the second input current.

In some embodiments, a first operational stage of the electrical circuit includes generating the first voltage difference. The first operation stage may additionally include generating the first charged state of the first capacitive element. A second operational stage of the electrical circuit includes generating the second voltage difference and generating the third voltage difference. The second operational stage may additionally include generating the second charged state of the second capacitive element. A third operational stage of the electrical circuit comprises generating the fourth voltage difference and generating the output current.

In some embodiments, a first pipelined operational stage of the electrical circuit comprises generating the first voltage difference and generating the first charged state of the first capacitive element. The first pipelined operational stage may additionally comprise generating the fourth voltage difference and generating the output current. A second pipelined operational stage of the electrical circuit comprises generating the second voltage difference and generating the third voltage difference. The second pipelined operational stage may additionally comprise generating the second charged state of the second capacitive element.

In some embodiments, the electrical circuit further comprises a plurality of switches that are synchronously operated to cyclically transition the electrical circuit from a first operational stage to a second operational stage, from the second operational stage to a third operational stage, and from the third operational stage to the first operational stage. In other embodiments, the electrical circuit further comprises a plurality of switches that are synchronously operated to cyclically transition the electrical circuit from a first pipelined operational stage to a second pipelined operational stage, and from the second pipelined operational stage to the first pipelined operational stage.

During the first operational stage, the switches may be configured such that the first terminal of the first transistor is connected to the input voltage and the second terminal of the first transistor has a first voltage such that the current flowing through the transistor is equivalent to the first input current. The first capacitive element may be charged in such a way as to be able to maintain the first voltage on the second terminal of the first transistor during subsequent operational stages.

During the second operational stage, the switches may be configured such that the second terminal of the first transistor has the first voltage as provided by the first capacitive element and the first terminal of the first transistor has a second voltage such that the current flowing through the transistor is equivalent to the second input current. The first terminal of the second transistor may have a voltage equivalent to the second voltage and the second terminal of the second transistor may have a third voltage such that the current flowing through the second transistor is equivalent to the third input current. In at least one embodiment, the second capacitive element is charged in such a way as to be able to maintain the third voltage on the second terminal of the second transistor during subsequent operational stages.

In some embodiments, during the third operational stage, the plurality of switches are configured such that the second terminal of the second transistor has the third voltage as provided by the second capacitive element and the first terminal of the second transistor is connected to the input voltage. An output current that is equivalent to the current may be flowing through the second transistor is outputted from the circuit.

During the first pipelined operational stage, the plurality of switches may be configured such that the first terminal of the first transistor is connected to the input voltage and the second terminal of the first transistor has a first voltage such that the current flowing through the transistor is equivalent to the first input current. The first capacitive element may be charged to maintain the first voltage on the second terminal of the first transistor during the subsequent second pipelined operational stage. The second terminal of the second transistor may have the third voltage as provided by the second capacitive element. The first terminal of the second transistor may be connected to the input voltage. An output current that is equivalent to the current flowing through the second transistor may be outputted from the circuit.

During the second pipelined operational stage, the plurality of switches are configured such that the second terminal of the first transistor has the first voltage as provided by the first capacitive element and the first terminal of the first transistor has a second voltage such that the current flowing through the transistor is equivalent to the second input current. The first terminal of the second transistor may have a voltage that is equivalent to the second voltage. The second terminal of the second transistor may have a third voltage such that the current flowing through the second transistor is equivalent to the third input current. The second capacitive element may be charged in such a way as to maintain the third voltage on the second terminal of the second transistor during the subsequent first pipelined operational stage.

In some embodiments, a capacitance of at least one of the first or second capacitive elements may be increased by employing an inverting voltage amplifier coupled to at least one of the first capacitive element or the second capacitive element.

In some embodiments, the electrical circuit further comprises one or more intermediate branches. At least one intermediate branch of the one or more branches may include a transistor and a capacitive element. At least one intermediate branch of the one or more intermediate branches may receive an additional first input current and an additional second input current. At least one intermediate branch of the one or more intermediate branches may generate a first additional voltage difference related to the first additional input current. At least one intermediate branch of the one or more intermediate branches may generate an additional charged state of its capacitive element. At least one intermediate branch of the one or more intermediate branches may generate a second additional voltage difference related to the second additional input current.

The first additional voltage difference may be logarithmically related to the first additional input current. The second additional voltage difference may be logarithmically related to the second additional input current. The output current may be equivalent to a ratio of a product of the odd numbered input currents to a product of the even numbered input currents. The electrical circuit may be employed in an analog computing application. At least one of the first transistor or the second transistor is operated in a sub-threshold regime.

What is claimed is:

1. A dynamic electrical circuit that receives a first input current, a second input current, a third input current, and an input voltage, the circuit comprising:
   an input branch that includes a first transistor—and a first capacitive element; and
   an output branch that includes a second transistor—and a second capacitive element, wherein the electrical circuit is configured to:
      generate a first voltage difference associated with the first input current, wherein the first voltage difference is a voltage difference between a first voltage and the input voltage, and wherein the first voltage is related to the first input current;
      generate a first charged state of the first capacitive element by storing the first voltage;
      generate a second voltage difference associated with the second input current, wherein the second voltage difference is a voltage difference between the first voltage and a second voltage, and wherein the second voltage difference is related to the second input current;
      generate a third voltage difference associated with the third input current, wherein the third voltage difference is a voltage difference between a third voltage and the second voltage, and wherein the third voltage difference is related to the third input current; and
      generate an output current by providing the input voltage and the third voltage, wherein the output current is related to a fourth voltage difference, and wherein the fourth voltage difference is the difference between the third voltage and the input voltage, and wherein a sum of the first voltage difference and the third voltage difference is equivalent to a sum of the second voltage difference and the fourth voltage difference.

2. The electrical circuit of claim 1,
   wherein the first voltage difference is logarithmically related to the first input current;
   wherein the second voltage difference is logarithmically related to the second input current;
   wherein the third voltage difference is logarithmically related to the third input current;
   wherein the output current is exponentially related to the fourth voltage difference; and
   wherein the output current is equivalent to a ratio of a product of the first and third input currents to the second input current.

3. The electrical circuit of claim 1,
   wherein a first operational stage of the electrical circuit comprises:
      generating the first voltage difference; and
      generating the first charged state of the first capacitive element;
   wherein a second operational stage of the electrical circuit comprises:
      generating the second voltage difference;
      generating the third voltage difference; and
      generating the second charged state of the second capacitive element; and
   wherein a third operational stage of the electrical circuit comprises:
      generating the fourth voltage difference; and
      generating the output current.

4. The electrical circuit of claim 1,
   wherein a first pipelined operational stage of the electrical circuit comprises:
      generating the first voltage difference;
      generating the first charged state of the first capacitive element;
      generating the fourth voltage difference; and
      generating the output current;
   wherein a second pipelined operational stage of the electrical circuit comprises:
      generating the second voltage difference;
      generating the third voltage difference; and
      generating the second charged state of the second capacitive element.

5. The electrical circuit of claim 1, further comprising:
   a plurality of switches that are synchronously operated to cyclically transition the electrical circuit from a first operational stage to a second operational stage, from the second operational stage to a third operational stage, and from the third operational stage to the first operational stage.

6. The electrical circuit of claim 1, further comprising a plurality of switches that are synchronously operated to cyclically transition the electrical circuit from a first pipelined operational stage to a second pipelined operational stage, and from the second pipelined operational stage to the first pipelined operational stage.

7. The electrical circuit of claim 5, wherein during the first operational stage, the switches are configured such that:
the first terminal of the first transistor is connected to the input voltage;
the second terminal of the first transistor has a first voltage such that the current flowing through the transistor is equivalent to the first input current; and
the first capacitive element is charged in such a way as to maintain the first voltage on the second terminal of the first transistor during subsequent operational stages.

8. The electrical circuit of claim 7, wherein during the second operational stage, the switches are configured such that:
the second terminal of the first transistor has the first voltage as provided by the first capacitive element;
the first terminal of the first transistor has a second voltage such that the current flowing through the transistor is equivalent to the second input current;
the first terminal of the second transistor has a voltage equivalent to the second voltage;
the second terminal of the second transistor has a third voltage such that the current flowing through the second transistor is equivalent to the third input current; and
the second capacitive element is charged in such a way as to maintain the third voltage on the second terminal of the second transistor during subsequent operational stages.

9. The electrical circuit of claim 8, wherein during the third operational stage, the plurality of switches are configured such that:
the second terminal of the second transistor has the third voltage as provided by the second capacitive element;
the first terminal of the second transistor is connected to the input voltage; and
an output current equivalent to the current flowing through the second transistor is outputted from the circuit.

10. The electrical circuit of claim 6, wherein during the first pipelined operational stage, the plurality of switches are configured such that:
the first terminal of the first transistor is connected to the input voltage;
the second terminal of the first transistor has a first voltage such that the current flowing through the transistor is equivalent to the first input current; and
the first capacitive element is charged to maintain the first voltage on the second terminal of the first transistor during the subsequent second pipelined operational stage;
the second terminal of the second transistor has the third voltage as provided by the second capacitive element;
the first terminal of the second transistor is connected to the input voltage; and
an output current equivalent to the current flowing through the second transistor is outputted from the circuit.

11. The electrical circuit of claim 6, wherein during the second pipelined operational stage, the plurality of switches are configured such that:
the second terminal of the first transistor has the first voltage as provided by the first capacitive element;
the first terminal of the first transistor has a second voltage such that the current flowing through the transistor is equivalent to the second input current;
the first terminal of the second transistor has the a voltage equivalent to the second voltage;
the second terminal of the second transistor has a third voltage such that the current flowing through the second transistor is equivalent to the third input current; and
the second capacitive element is charged in such a way as to maintain the third voltage on the second terminal of the second transistor during the subsequent first pipelined operational stage.

12. The electrical circuit of claim 1, wherein a capacitance of at least one of the first or second capacitive elements is increased by employing an inverting voltage amplifier coupled to at least one of the first capacitive element or the second capacitive element.

13. The electrical circuit of claim 1, wherein the electrical circuit further comprises one or more intermediate branches, wherein
at least one intermediate branch of the one or more intermediate branches includes a transistor and a capacitive element;
at least one intermediate branch of the one or more intermediate branches receives an additional first input current and an additional second input current;
at least one intermediate branch of the one or more intermediate branches generates a first additional voltage difference related to the first additional input current;
at least one intermediate branch of the one or more intermediate branches generates an additional charged state of its capacitive element; and
at least one intermediate branch of the one or more intermediate branches generates a second additional voltage difference related to the second additional input current.

14. The electrical circuit of claim 13,
wherein the first additional voltage difference is logarithmically related to the first additional input current;
wherein the second additional voltage difference is logarithmically related to the second additional input current;
wherein the output current is equivalent to a ratio of a product of the odd numbered input currents to a product of the even numbered input currents.

15. The electrical circuit of claim 1, wherein the electrical circuit is employed in an analog computing application.

16. The circuit of claim 1, wherein at least one of the first transistor or the second transistor is operated in a subthreshold regime.

17. A method of operating an electrical circuit that includes an input branch and an output branch, the method comprising:
generating a first voltage difference associated with a first input current received by the electrical circuit, wherein the first voltage difference is a voltage difference between a first voltage and an input voltage received by the electrical circuit, and wherein the first voltage is related to the first input current;

generating a first charged state of a first capacitive element of the input branch by storing the first voltage;

generating a second voltage difference associated with a second input current received by the electrical circuit, wherein the second voltage difference is a voltage difference between the first voltage and a second voltage, and wherein the second voltage difference is related to the second input current generating a third voltage difference associated with a third input current received by the electrical circuit, wherein the third voltage difference is a voltage difference between a third voltage and the second voltage, and wherein the third voltage difference is related to the third input current; and generating an output current by providing the input voltage and the third voltage, wherein the output current is related to a fourth voltage difference, and wherein the fourth voltage difference is the difference between the third voltage and the input voltage, and wherein a sum of the first voltage difference and the third voltage difference is equivalent to a sum of the second voltage difference and the fourth voltage difference.

18. The method of claim 17,
wherein the first voltage difference is logarithmically related to the first input current;
wherein the second voltage difference is logarithmically related to the second input current;
wherein the third voltage difference is logarithmically related to the third input current;
wherein the output current is exponentially related to the fourth voltage difference; and
wherein the output current is equivalent to a ratio of a product of the first and third input currents to the second input current.

19. The method of claim 1,
wherein a first operational stage of the method comprises:
    generating the first voltage difference; and
        generating the first charged state of the first capacitive element;

wherein a second operational stage of the method comprises:
    generating the second voltage difference;
    generating the third voltage difference; and
    generating the second charged state of the second capacitive element; and wherein a third operational stage of the method comprises:
    generating the fourth voltage difference; and
    generating the output current.

20. An electrical circuit that receives a first input current, a second input current, a third input current, and an input voltage, the electrical circuit being configured to:

generate a first voltage difference associated with the first input current, wherein the first voltage difference is a voltage difference between a first voltage and the input voltage, and wherein the first voltage is related to the first input current;

generate a first charged state of a first capacitive element of the electrical circuit by storing the first voltage;

generate a second voltage difference associated with the second input current, wherein the second voltage difference is a voltage difference between the first voltage and a second voltage, and wherein the second voltage difference is related to the second input current;

generate a third voltage difference associated with the third input current, wherein the third voltage difference is a voltage difference between a third voltage and the second voltage, and wherein the third voltage difference is related to the third input current; and generate an output current by providing the input voltage and the third voltage, wherein the output current is related to a fourth voltage difference, and wherein the fourth voltage difference is the difference between the third voltage and the input voltage, and wherein a sum of the first voltage difference and the third voltage difference is equivalent to a sum of the second voltage difference and the fourth voltage difference.

* * * * *